(12) United States Patent
Kato

(10) Patent No.: US 7,635,980 B2
(45) Date of Patent: Dec. 22, 2009

(54) MRI APPARATUS AND AN MRI BED APPARATUS

(75) Inventor: Yutaka Kato, Utsunomiya (JP)

(73) Assignees: Kabushiki Kaisha Toshiba, Tokyo (JP); Toshiba Medical Systems Corporation, Otawara-shi (JP)

(*) Notice: Subject to any disclaimer, the term of this patent is extended or adjusted under 35 U.S.C. 154(b) by 0 days.

(21) Appl. No.: 12/060,523

(22) Filed: Apr. 1, 2008

(65) Prior Publication Data

US 2008/0246478 A1  Oct. 9, 2008

(30) Foreign Application Priority Data

Apr. 2, 2007  (JP) ............................ 2007-096559

(51) Int. Cl.
*G01V 3/00* (2006.01)

(52) U.S. Cl. .................. 324/318; 324/322; 600/421; 600/422

(58) Field of Classification Search .............. 324/318, 324/322; 600/421, 422
See application file for complete search history.

(56) References Cited

U.S. PATENT DOCUMENTS

| 5,361,765 | A | * | 11/1994 | Herlihy et al. ............... 600/422 |
| 5,390,672 | A | * | 2/1995 | Jones ........................ 600/422 |
| 5,808,468 | A | * | 9/1998 | Bis et al. .................... 324/318 |
| 7,365,542 | B1 | * | 4/2008 | Rohling et al. .............. 324/318 |
| 2009/0072107 | A1 | * | 3/2009 | Wilson et al. ............. 248/279.1 |

FOREIGN PATENT DOCUMENTS

JP  2-68036  3/1990

* cited by examiner

*Primary Examiner*—Louis M Arana
(74) *Attorney, Agent, or Firm*—Oblon, Spivak, McClelland, Maier & Neustadt, L.L.P.

(57) ABSTRACT

The test body is placed on the top board. The support section has a support post, a hinge section and a receiving member. The hinge section is linked to the edge of the shorter direction of said top board at one edge of the support post and performs a hinge movement in said shorter direction. The receiving member holds said test body and supports RF coils, when it is positioned on the other edge of the support post and said support post is caused to stand up by the hinge movement. The support section is positioned on both edges of said shorter direction of said top board.

10 Claims, 5 Drawing Sheets

MRI APPARATUS AND AN MRI BED APPARATUS

BACKGROUND OF THE INVENTION

1. Field of the Invention

The present invention relates to an MRI apparatus for taking MRI images of a subject, and a bed apparatus on which a test body is placed as the subject of the MRI images.

2. Description of the Related Art

MRI (Magnetic Resonance Imaging) apparatus is a medical imaging apparatus such that when the applied magnetic field is applied to a test body placed on the bed apparatus in the static magnetic field, an excitation magnetic field (RF magnetic field) is applied from an excitation magnetic field coil (transmitter RF coil) to obtain nuclear magnetic resonance signals (MR signals) with a nuclear magnetic resonance signal coil (receiver RF coil), and the MRI images (cross-sectional images) of said test body are reconstituted on the basis of the obtained nuclear magnetic resonance signals (MR signals).

If tomography is carried out using such an MRI apparatus, many RF (Radio Frequency) coils need to be placed in order to obtain a high-quality image. Hence, in capturing images of the test body covered with a unit (sheet) arranged with RF coils, the test body is covered with the unit's many RF coils, Therefore, the test body feels the massive weight and there is a loss of comfort during the capturing of the images.

So, reducing the weight of the coils was attempted, in order to reduce the weight placed on the test body. But there is a limit to reduce the weight of the coils, due to the increase of RF coils accompanying multichannelizing and the corresponding increase in electrical components involved.

For this purpose, an MRI apparatus has been proposed, consisting of placing a hard wagon-head shaped board (hereinafter called "forma") on the test body and placing a sheet arranged with receiver RF coils on it (for example, refer to Japanese published unexamined application No. 09-075323.) Also there is an MRI apparatus to reduce the weight on the test body by using hard materials for the unit that is arranged with RF coils, in order to have a shared forma.

However, in configurations where the RF coils require a forma (a member which supports RF coils by adjusting them to the placement site), aside from the unit that is arranged with RF coils, a set of two steps is needed, namely a big forma to cover the body and a sheet with RF coils. And in cases where the forma and the unit that is arranged with RF coils are shared, the unit that is arranged with RF coils, which is shared with the forma, becomes larger and heavier, and it is difficult for the operator to handle it. In addition, if the test body is large, it is difficult for the operator to observe the location of the forma across the test body, which is placed on the bed apparatus, on the opposite side from the operator.

SUMMARY OF THE INVENTION

In view of such a situation, the present invention aims to provide an MRI apparatus and an MRI bed apparatus for imaging, in the state that the RE coils are supported from the bed apparatus side.

The first embodiment of this invention will be described. The MRI apparatus related to this embodiment comprises a top board and a bed apparatus with a support section, on which the test body is placed, high frequency coils and an image generator. The high frequency coils detect magnetic resonance signals radiated from said test body by applying an applied magnetic field and a high frequency magnetic field to the test body within a static magnetic field. Said support section has a support post. One edge of said support post is connected to the edge of the shorter direction of said top board. It has a hinge section, which operates in a hinge movement toward said shorter direction on one edge of said support post. Said support post has a receiving member to support said high frequency coils on another of its edges, across said test body, such that said support post stands due to said hinge movement. Said support section is placed on both edges of said shorter direction of said top board. The image generator generates image data on the basis of said magnetic resonance signals. The first embodiment of the invention is an MRI apparatus structured as indicated above.

The second embodiment of this invention will now be described. The MRI bed apparatus related to this embodiment has a top board, on which the test body is placed, and a support section. Said support section has a support post. One edge of said support post is connected to the edge of the shorter direction of said top board. Moreover, it has a hinge section that operates in a hinge movement toward said shorter direction on one edge of said support post. Said support post has a receiving member to support said high frequency coils on another of its edges, across said test body, such that said support post stands due to said hinge movement. Said support section is placed on both edges of said shorter direction of said top board. The second embodiment of this invention is an MRI bed apparatus structured as indicated above.

According to the MRI apparatus of the first and second embodiments of this invention, it is possible to maintain a state in which said high frequency coils are kept away from the test body, or are only slightly on the test body, by supporting the high frequency coils, from below, with the support section. This reduces the weight of the high frequency coils on the test body, and it is thus possible to improve comfort during the capture of images.

DETAILED DESCRIPTION OF THE EMBODIMENTS

The First Embodiment

Configuration of the Bed Apparatus

Figure 1:
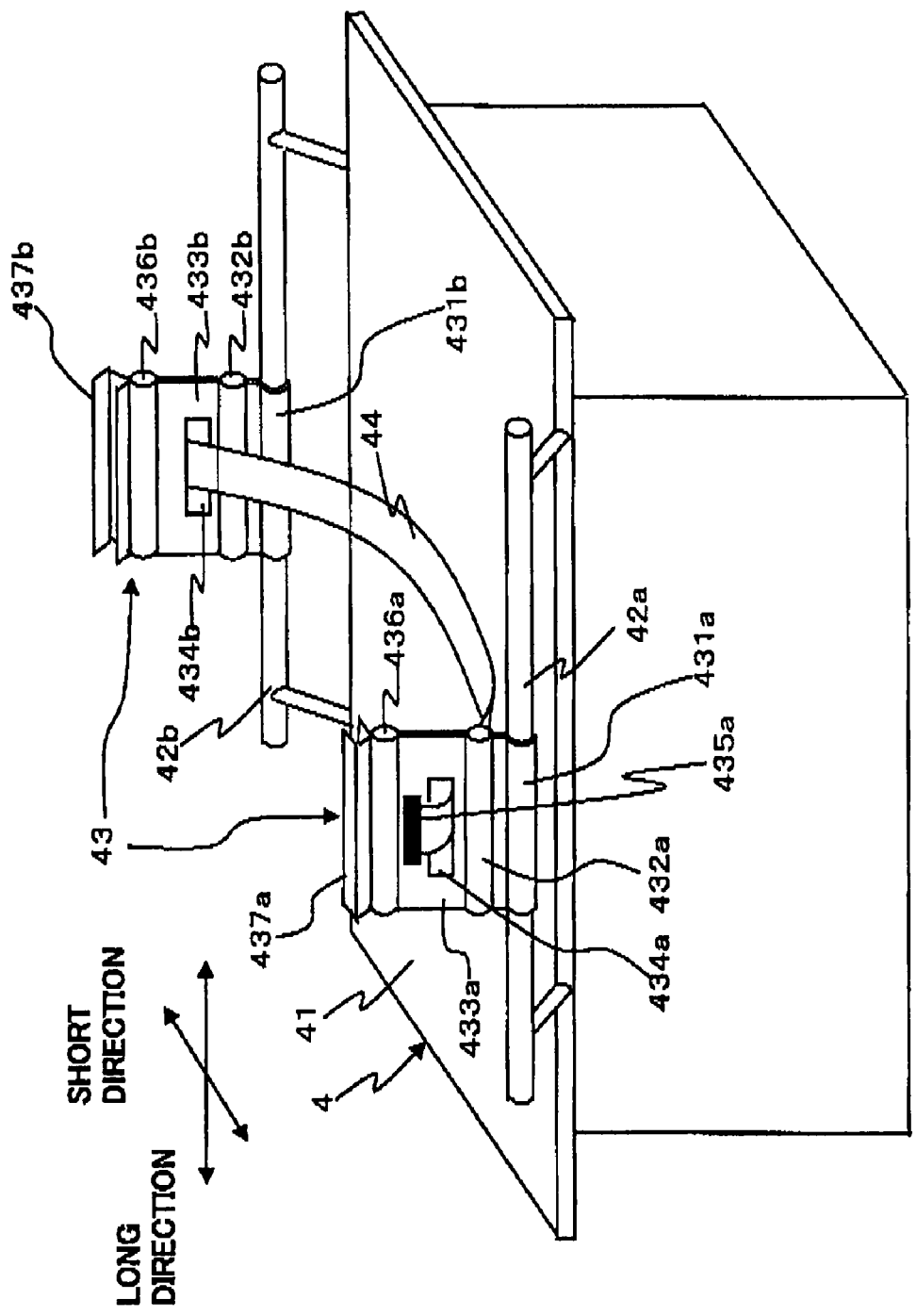
FIG. 1: A perspective diagram of the exterior configuration of the bed apparatus of the MRI apparatus according to the first and second embodiments.
Figure 2:
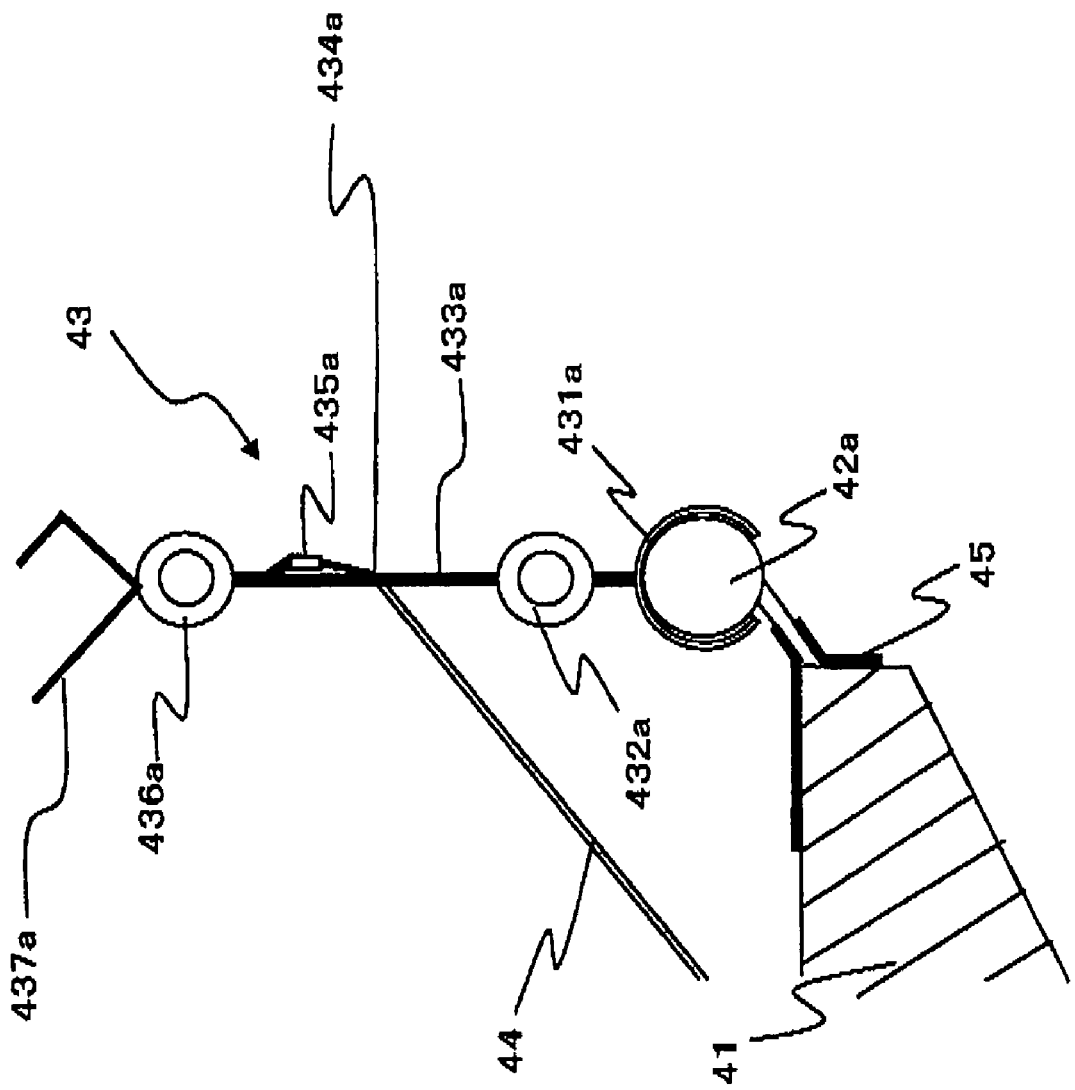
FIG. 2: A cross section diagram of a part of the bed apparatus and the support section according to the first and second embodiments.
Figure 3:
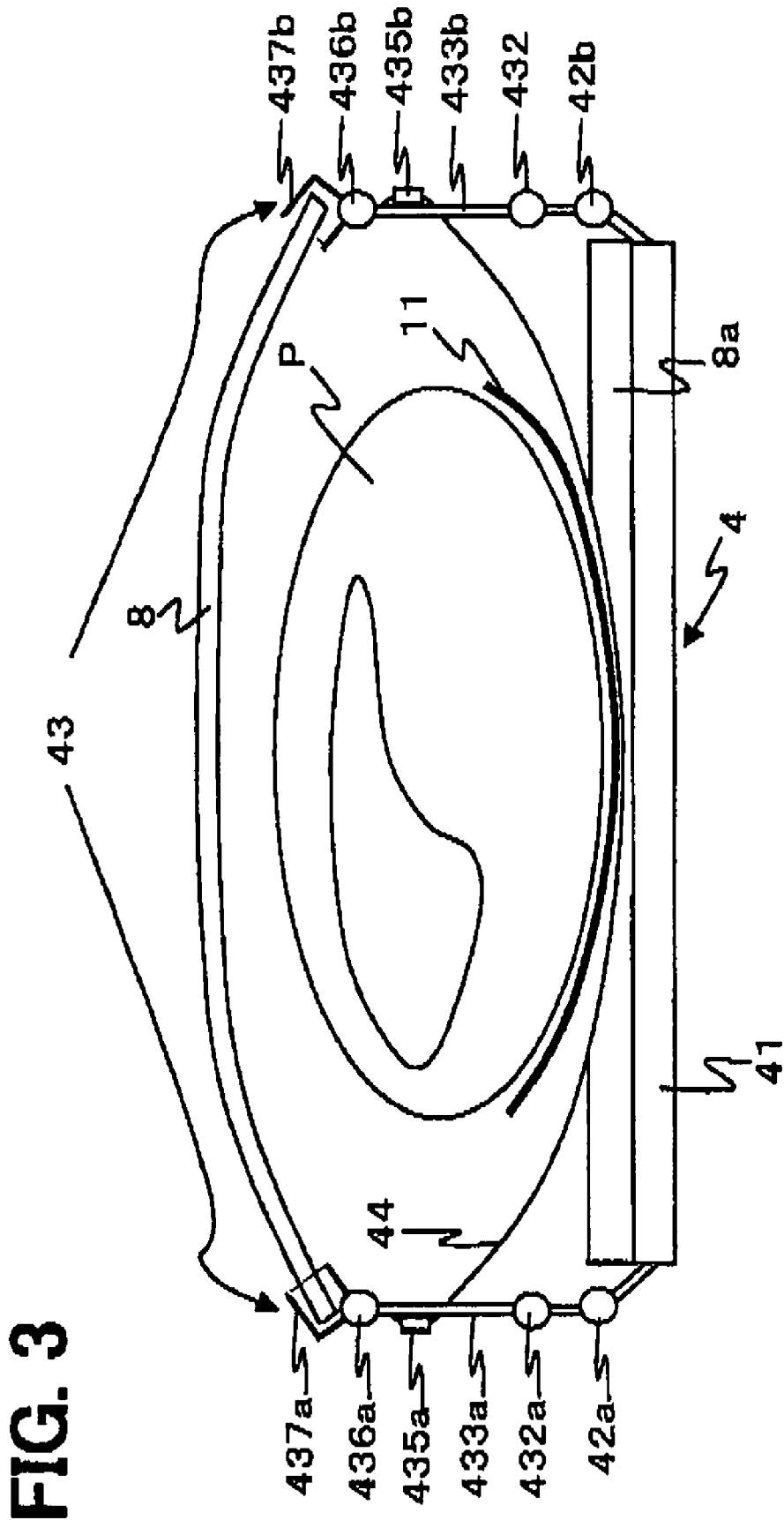
FIG. 3: A cross section diagram of a state in which the test body is placed on the bed apparatus according to the first and second embodiments.

The configuration of the bed apparatus 4 in this MRI device will be described. FIG. 1 represents an example of the exterior configuration of a support section positioned on a top board 41 of a bed apparatus 4. FIG. 2 represents a cross section diagram of the bed apparatus relating to this embodiment. FIG. 3 is a cross section diagram, in which the test body and RF coils 8 are placed on the bed apparatus relating to this embodiment.

The bed apparatus 4 shown in FIG. 1 and FIG. 2 is used to support the RF coils 8 with a support section 43 from below. For this purpose, the test body P is placed on top board 4 for the capture of images with the MRI apparatus, and the RF coils 8 are placed on it as shown in FIG. 3.

RF coils 8 are structured so as to have the shape like a flat board. Furthermore, if both edges are supported from below, RF coils 8 bend in the upward direction or maintain their current state, and is hard enough to prevent collapsing in a downward direction. Moreover, RF coils 8 are described below, with coils having a size of 50 cm square. However, it is necessary to modify the size of RF coils 8 to suit the area of interest, and corresponding with that, it is preferable to also modify the size of support section 43, as will be explained below. These RF coils 8 represent the "high frequency coils" of the present invention.

The bed apparatus 4 comprises paired rail 42a and rail 42b, which are arranged along the longer direction (the body axis direction of test body P, which has been positioned on top board 41) at both edges of its shorter direction. It is desirable for rail 42a and rail 42b, when test body P climbs to top board 41 and when it descends from top board 41, to be produced from elements that have the flexibility to bend in the shorter direction of top board 41. Furthermore, in order for it to be possible for this material to withstand repeated use, it is also desirable for it to be excellent in terms of durability (strength, impact resistance, etc.) Additionally, it is desirable for the material to also be excellent in terms of its sliding properties, so that the linked members 431a and 431b smoothly move on rails 42a and 42b, as described below. As a material that is able to fulfill such conditions, there are polyacetals, for example.

Rail 42a and rail 42b are connected to the top board 41 by face fastener 45, which enables it to be removable, as shown in FIG. 2. In cases where rail 42a and rail 42b are configured to be removable from top board 41, it is easier to carry the patient on to top board 41. In this regard, it is not necessary for rail 42a and rail 42b to be limited to being removably connected to top board 41; for example, it is also acceptable to bond them to each other using an adhesive, etc., or to affix them to each other by tying them to their surroundings using a string member, etc.

Figure 4:
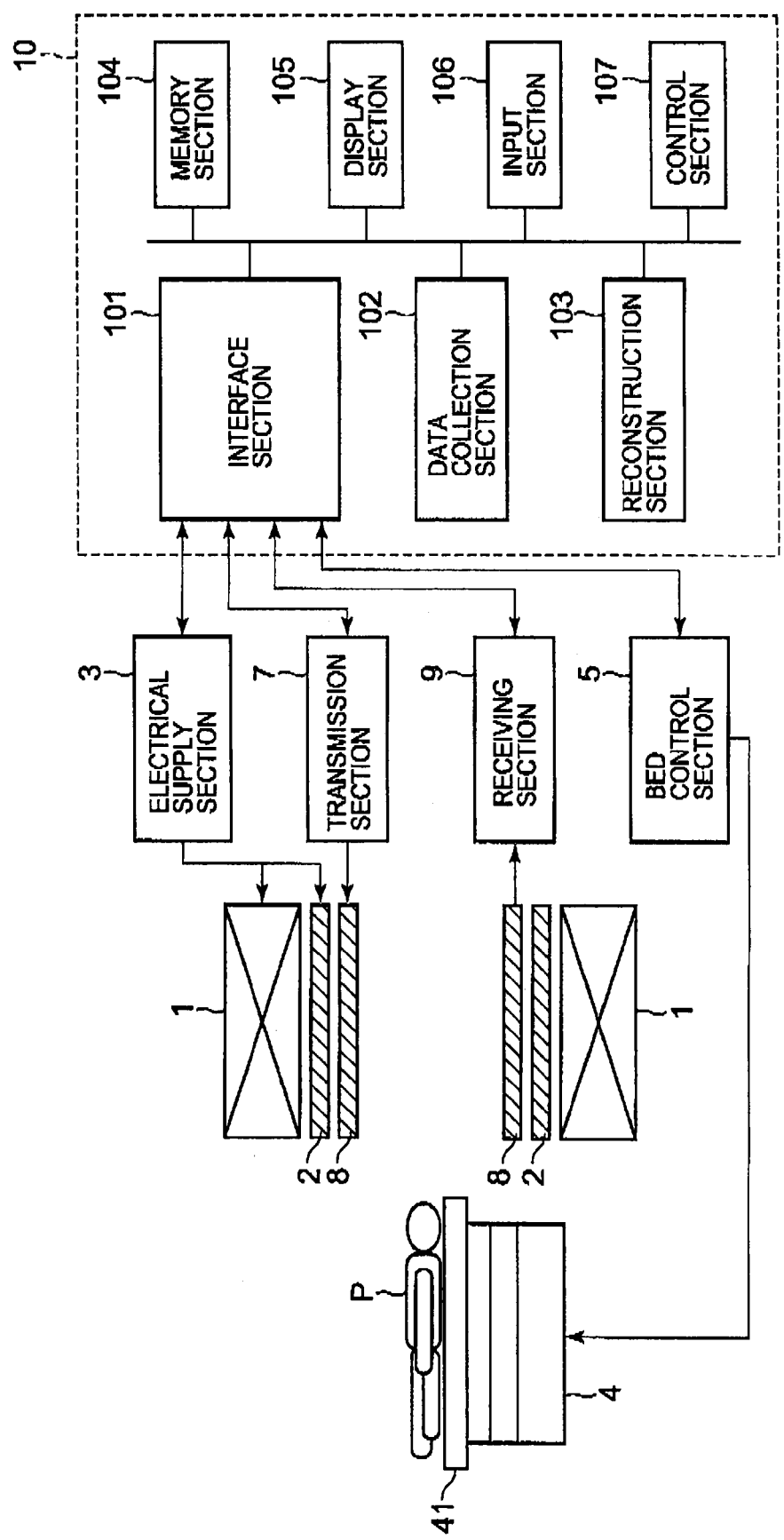
FIG. 4: A block diagram of the entire configuration of the MRI apparatus according to the first and second embodiments.

Support section 43 is positioned in pairs on both edges of bed apparatus 4. As shown in FIG. 1, each support section 43 has connection members 431a and 431b, hinge sections 432a and 432b, plate members 433a and 433b, which are the support posts, slits 434a and 434b, buckle 435a (the opposite support section 43 has a buckle corresponding to this, but it is hidden by plate member 433b and cannot be seen), hinge sections 436a and 436b, and receiving members 437a and 437b. Plate members 433a and 433b, and receiving members 437a and 437b, which are in support section 43, are 10 cm wide in the longer direction as shown in FIG. 4. In the present case, in the present embodiment, the width of support section 43 is set to 10 cm in order to support RF coils 8 with coils that are 50 cm square in size, but it is preferable to change this in consideration of the size of RF coils 8 to be supported and the strength of support section 43.

Two support sections 43 which are positioned on both edges of top board 41 have the same structure, so the following explains support section 43, which comprises connection member 431a, hinge section 432a, plate member 433a, slit 434a, buckle 435a, hinge section 436a and receiving member 437a, as shown in FIG. 1.

Connection member 431a, as shown in FIG. 2, comprises an engaging section configured so that its inner circumference is adapted to engage with the outer circumference surface of rail 42a. Connection member 431a has a cross section that has a round arch form. Rail 42a takes a columnar form. Therefore, as shown in FIG. 2, connection member 431a is connected to rail 42a so as to cover one part of rail 42a. And, with connection member 431a adapted to engage to rail 42a in such a condition, as shown in FIG. 1, connection member 431a is able to move along rail 42a, which runs along the longer direction of top board 41. It is also possible to remove it by moving it to the edge of rail 42a. It is desirable to form this connection member 431a from materials that are excellent in terms of flexibility, endurance, sliding properties, etc., such as polyacetals, etc. Connection member 431a is configured so as to disable its movement in the shorter direction.

Connection member 431a extends upward (in the direction away from top board 41) from the engaging section mentioned above and is connected to hinge section 432a. In order to prevent movement in the longer direction arising from pressure from above, connection member 431a is configured to increase the friction between the engaging section and rail 42a.

Hinge section 432a is configured to perform hinge movements with greater flexibility. Due to the hinge movement of this hinge section 432a, the plate member 433a, the receiving members 437a, etc., are able to fold down in the direction of top board 41 of bed apparatus 4, or toward the exterior of bed apparatus 4 (in the opposite direction to top board 41).

In the present embodiment, hinge section 432a is positioned separately from connection member 431a, but it is also acceptable to incorporate the function of hinge section 432a into connection member 431a, by allowing connection member 431a to move in the shorter direction.

Plate member 433a extends upward from hinge section 432a and connects to hinge section 436a. Plate member 433a is 25-30 cm in height (the distance of separation from the top board, when it stands upright.) In the present embodiment, because the test body which is to be placed on bed apparatus 4 may take various forms, it is necessary to reduce the weight of RF coils 8 on various test bodies P, and to fix the length at 25-30 cm, so as not to create a gap between RF coils 8 and test body P. In practice, the length of plate member 433a should be determined on the basis of the gap between the size of test body P and the required RF coils 8.

This plate member 433a has a slit 434a, as shown in FIG. 1. Slit 434a is equipped with buckle 435a in its upward direction (toward the direction apart from top board).

This buckle 435a has a convex section and a concave section. And either the convex section or the concave section is arranged on plate member 433a. In the description of the present embodiment, a concave section is arranged on plate member 433a. With a convex section on buckle 435a and a concave section on buckle 435a in combination, buckle 435a is configured to affix a belt 44 on support section 43.

Slit 434a is a hole through which belt 44 is placed, and the size of slit 434a is smaller than the convex section on buckle 435a. For this reason, the convex section on buckle 435a is not able to pass through slit 434a, and buckle 435a will be lodged in plate member 433a. This prevents the operator from failing to see belt 44. As shown in FIG. 2, belt 44 is connected to support section 43 with buckle 435a, which is positioned on the exterior of bed apparatus 4. In addition, belt 44 goes through plate member 433a and out to the edge of top board 41 on bed apparatus 4.

Hinge section 436a is directed to adjust the aperture of receiving section 437a in the direction of the coils, so it is configured to perform hinge movements less flexibly than hinge section 432a, Hinge section 436a is connected to receiving member 437a in its upward direction.

Receiving member 437a has a U-shaped form. Receiving member 437a is configured to be able to change the direction of its socket, which is a U-shaped aperture, through the hinge movement of hinge section 436a. This hinge movement makes it easier to place RF coils into the socket in receiving member 437a. As shown in FIG. 3, receiving member 437a holds RF coils 8 from both sides of the shorter direction of bed apparatus 4 and supports RF coils 8 from below. In the present embodiment, as RF coils 8 have a certain hardness as described above, when both sizes are supported with receiving member 437a, it is possible to maintain a condition such that it will not lean toward the top board but will bend upward and be supported. Moreover, thanks to belt 44, support section 43 is restrained so as to prevent it from collapsing toward the exterior of bed apparatus 4, so support section 43 stands upright due to the pushing force toward the exterior of bed apparatus 4 applied to receiving member 437a from RF coils 8.

In the present embodiment, hinge section 436a is equipped separately in order to make receiving member 437a movable. This enables receiving member 437a to move by the flexibility of support section member 43, if it is made from materials such as flexible plastics. So, in such a case, it is not especially necessary to install hinge section 436a.

Belt 44 has enough length that it will not come off from slit 434a or slit 434b when both support sections 43 are collapsed toward the exterior of the bed apparatus 4. This will enable the operator to find belt 44 with certainty, from either side, when the patient is placed on bed apparatus 4 with support section 43 being collapsed.

Belt 44 has a concave section of buckle 435 on one of its edges. And belt 44 has a concave section of another buckle on the other edge. As described above, by engaging the concave section of buckle 435a and the concave section of the other buckle with the convex section of buckle 435a and the convex section of the other buckle respectively, belt 44 is connected to both support sections 43.

In the present embodiment, buckle 435a is used for connecting belt 44 with support sections 43. With respect to the method of connection, other configurations may also be suitably deployed. For example, adhesion may be used for connection. And it is also acceptable to use a string member to connect to the surroundings.

It is possible to drag support section 43, which is on the opposite side across from bed apparatus 4, by pulling belt 44 to the exterior of bed apparatus 4. This causes support section 43 to stand facing bed apparatus 4. In this way, because pulling belt 4 allows support section 43 to stand, which is on the opposite side across from bed apparatus 4, even if the test body is placed on the bed apparatus 4 and it is difficult to see the opposite side of the bed apparatus when the size of the test body is large, it is possible to make support section 43, which is on the opposite side, stand without searching for it.

As shown in FIG. 3, belt 44 is connected to support section 43, which is on both edges of top board 41. So, when support section 43 receives RF coils 8 at receiving members 437a and 437b with the test body P in the middle so as to hold it from both sides, RF coils will be pulled downward under the weight of the test body, and as a result of this, RF coils 8 are configured to pull support section 43 on both sides toward the top board 41. Because of the force of belt 44 in pulling support section 43 toward top board 41, against the force of RF coils pushing support section 43 toward the exterior of bed apparatus 4, support section 43 cannot collapse toward the exterior of bed apparatus 4.

Moreover, in the present embodiment, if test body P is placed on bed apparatus 4, as shown in FIG. 3, sheet 11 is held between top board 41 and the test body. Here, sheet 11 is large enough to place the whole of test body P on it. The surface of sheet 11 in contact with test body P is made of water-repellent materials. The surface of sheet 11 in contact with top board 41 is made from slippery materials, for example, polyethylene, Teflon coating and so on. Moreover, in the present embodiment, as shown in FIG. 3, the underside of RF coils 8a is positioned so as to generate images with higher quality. This can be replaced with a simple mat, in order to make the bed comfortable for test body P. Also test body P can be placed on top board 41 directly without a mat.

When test body P is placed on bed apparatus 4, belt 44 is configured to pass through top board 41 between sheet 11 and top board 41. This reduces the friction with sheet 11 when the weight of test body P is placed on belt 44, and this enables belt 44 to slide smoothly in the longer direction Alternative will also be described. A rail is provided on both edges of the shorter direction of sheet 11. A connection member movable in the longer direction is provided on this rail. Subsequently, belt 44 is passed through the connection member that is placed on one edge of sheet 11, and passes through between top board 41 and sheet 11. Moreover, it passes through the connection member that is placed on the other side of sheet 11, and it connects to each support section 43 that is positioned on both edges of the shorter direction of bed apparatus 4. In this way, belt 44 and sheet 11 are connected together so as to move in the longer direction. The configuration above is also possible. With such a configuration, it is easier for belt 44 to move in the longer direction of top board 41, which makes it easier to change the position of belt 44.

Overall Operation of the MRI Apparatus

Next, the MRI apparatus having an MRI bed apparatus, which relates to the first embodiment described above, will be described. FIG. 4 is a block diagram, which describes the function of the MRI apparatus related to the present embodiment. An MRI apparatus, which is shown in FIG. 4, is an apparatus that detects the data that reflects the internal morphology or the function of a test body fixed on the top board, and generates the image data of a cross section image on the basis of the detected data.

Static magnetic field magnet 1 is formed from a hollow circular cylinder, and generates a uniform static magnetic field in its interior space. As examples of a static magnetic field magnet, a permanent magnet or a super conductive magnet may be used.

Applied magnetic field coil 2 is formed from a hollow circular cylinder, and it is arranged in the interior space formed by static magnetic field magnet 1. This applied magnetic field coil 2 is formed from the combination of 3 coils corresponding to each axis in a predetermined 3 dimensional Cartesian coordinate system (XYZ coordinate system). These 3 coils generate the applied magnetic field that applies the magnetic field intensity along each axis X, Y and Z by receiving an electrical supply respectively from the electrical supply section 3.

In addition, the Z axis is arranged in the direction of the axis of test body P (in the longer direction of top board 41, as described later), and static magnetic field magnet 1 generates the static magnetic field in the Z direction. Each applied magnetic field of X, Y and Z corresponds to, for example, an applied magnetic field for slice selection, an applied magnetic field for encoding, and an applied magnetic field for read out respectively.

The applied magnetic field for slice selection is used for making arbitrary decisions to capture cross sections. The applied magnetic field for phase encoding is used to encode the phase of the magnetic resonance signal, corresponding with a spatial position. The applied magnetic field for read out is used to encode the phase of the magnetic resonance signal, corresponding with the spatial position.

Test body P is set within the interior space (capture location) of applied magnetic field coil 2, being placed on top board 41 of bed apparatus 4. Top board 41 is activated by bed control section 5, and each is moved in its longer section, or vertically. Generally bed apparatus 4 is positioned so that the longer direction of this top board 41 will become parallel to the central axis of static magnetic field magnet 1. In addition, the details of the configuration of bed apparatus 4 will be described later.

RF coils 8 are positioned within the interior space of applied magnetic field coil 2. RF coil 8 generates a high frequency magnetic field by receiving a high frequency pulse supply from transmission section 7.

Transmission section 7 sends the high frequency pulses to RF coils 8, and comprises an oscillation section, a phase selection section, a frequency conversion section, an amplitude modulation section, a high frequency power amplification section, etc. (not all are shown in the diagram)

An oscillation section generates a high frequency signal of a distinct resonant frequency for the target atomic nucleus in the static magnetic field. The phase selection section performs the process of selecting a phase of this high frequency signal. The frequency conversion section performs the process of converting the frequencies of the high frequency signals that are output from the phase selection section. The amplitude modulation section performs the process of modulating the amplitude of high frequency signals output from the frequency conversion section, in accordance with functions such as the sinc function (sinc(x)=sin (x)/x), for example. A high frequency power amplification section performs the process of magnifying the high frequency signals that are output from the amplitude modulation section. Transmission section 7, transmits the high frequency pulses corresponding with the Larmor frequency, which is obtained by the high frequency power amplification section, to RF coils 8.

RF coils 8 receive the respective magnetic resonance signals emitted from test body P, due to the effect of the generated high frequency magnetic field, and output to receiving section 9 a signal that shows the receiving result.

Receiving section 9 generates data regarding the respective magnetic resonance signals over several receiving channels on the basis of the signals output from RF coils 8.

Arithmetic control section 10 has an interface section 101, a data collection section 102, a reconstruction section 103, a memory section 104, a display section 105, an input section 106 and a control section 107.

Interface section 101 is connected with electrical supply section 3, bed control section 5, transmission section 7, receiving section 9, etc. Interface section 101 performs the process of transmitting and receiving signals between each of these sections and arithmetic control section 10.

Through interface section 101, data collection section 102 collects the magnetic resonance signal data emitted from receiving section 9. Data collection section 102 transmits the collected magnetic resonance signal data (digital signal) to memory section 104 and stores the data in memory section 104.

Reconstruction section 103 performs image reconstruction processing using a Fourier transform, etc., on the magnetic resonance signal data stored in memory section 104, and determines the desired nuclear spin spectral data and image data for test body P in vivo. By this process, the image data of cross section image of test body P is generated.

Memory section 104 stores the respective data, such as magnetic resonance signal data, spectrum data, image data etc. This data, for example, can be stored for each patient.

Display section 105 displays all sorts of images and pictures on the basis of each type of data, such as spectrum data, image data, etc. The control of this display processing is performed by controls section 107. As the display section 105, an arbitrary display device such as an LCD (Liquid Crystal Display), for example, can be used.

Input section 106 enters various types of command and information instructed from the examiner. As the input section 106, an arbitrary input device or operating device, such as keyboard, mouse, track ball, joystick, control panel, pen tablet, etc., can be used.

Control section 107 comprises a microprocessor, a memory drive, and etc., which are not shown in the diagrams, and controls each section of the MRI apparatus individually or simultaneously.

Transmission section 7, receiving section 9, and arithmetic control section 10, which are described above, embody the Image Generator in the present invention.

EFFECTS

According to the MRI apparatus (bed apparatus) that relates to the present embodiment as described above, support section 43 can be removed from bed apparatus 4, and easily place test body P on top board 41 of the bed apparatus, because it collapses outward widely, even when it is installed on bed apparatus 4.

Support section 43 supports RF coils 8 from below, so it is possible to perform imaging while test body P with RF coils 8 on does not feel the weight of RF coils or it is felt only slightly. This will improve comfort for test body P during image capture.

The test body may be too large for the examiner to see the test body, if support section 43 on the opposite side across the bed apparatus 4 from the examiner collapses outward the bed apparatus 4. In this case, pulling belt 44 extending to the examiner's side allows support section 43 to stand up, allowing searching for supporting section 43 out of sight to be unnecessary.

Moreover, support section 43 is able to slide on rail 42a and rail 43b, which are connected to bed apparatus 4, and to support RF coils 8 in any position in the longer direction, so it is possible to change the position of RF coils 8, corresponding with the part of test body P being captured. Additionally, belt 44 passes through between sheet 11 and top board 41, and suppresses the effects of the increase in friction due, to the weight of the test body. Thus, it is possible to modify the position of belt 44 in the longer direction, which makes it possible to change the position of RF coils 8 in the longer direction more freely.

The Second Embodiment

The MRI bed apparatus described here relates to the second embodiment of the present invention. The MRI bed apparatus that relates to the second embodiment is configured so that it is possible to change the height of support section 43 in the first embodiment. Here height refers to the distance from top board 41 to receiving member 437a or to receiving member 437b. A configuration to change the height of support section 43 will be mainly described below. Two support sections 43 that are arranged on both edges of top board 41 have the same configuration, so support section 43, which comprises connection member 431a, hinge section 432a, plate member 433a, slit 434a, buckle 435a, hinge section 436a and receiving member 437a, as shown in FIG. 1, will be described below.

Figure 5:
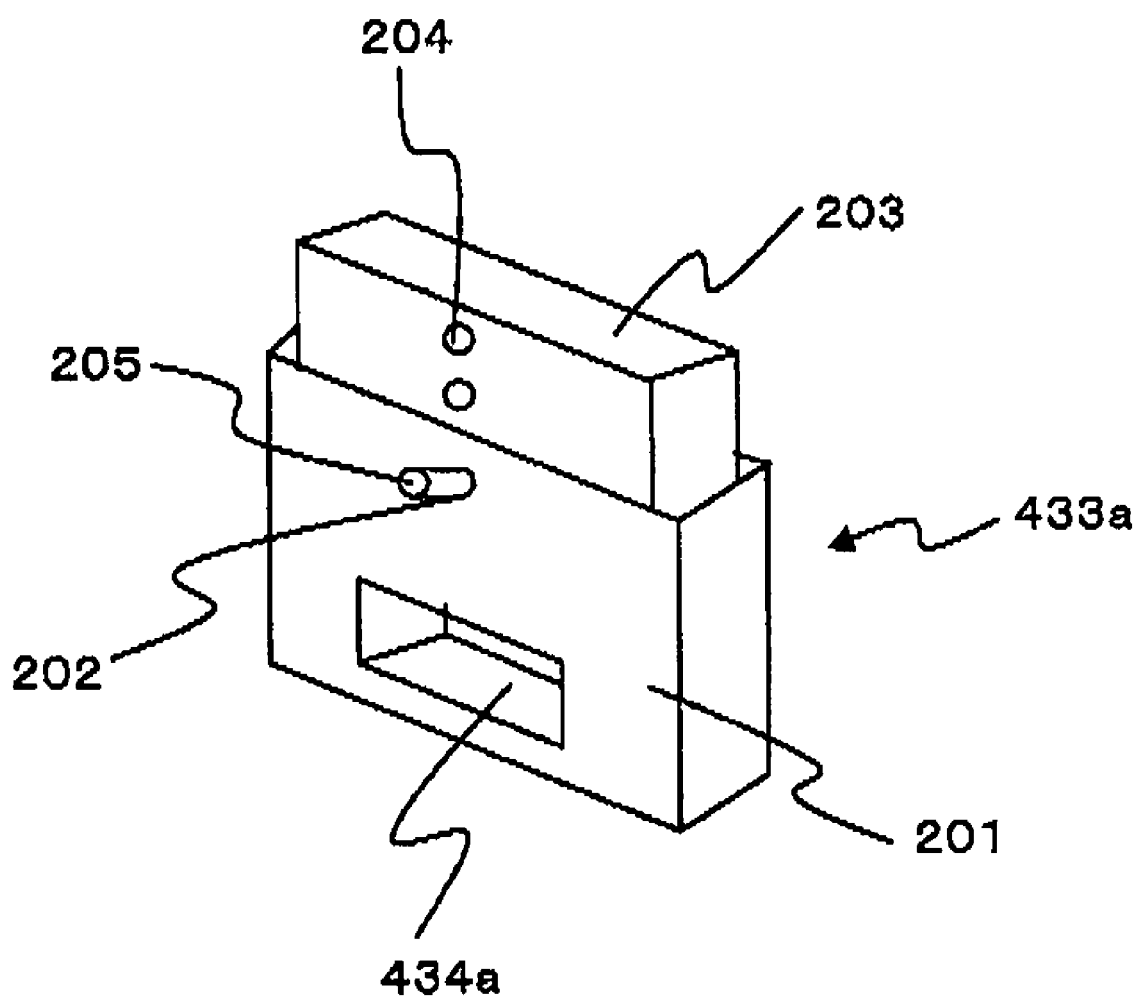
FIG. 5: A perspective diagram of a plate member according to the second embodiment.

FIG. 5 describes plate member 433a among support section 43. Support section 43, which relates to the present embodiment, has the same configuration as the one in the first embodiment, expect for plate member 433a.

As described in FIG. 5, plate member 433a comprises a receiving member 201 and an insertion member 203.

Receiving member 201 has a slit 434a. Additionally, receiving member 201 is hollow. Receiving member 201 is open on the opposite side from top board 41 when support section 43 is standing up. Furthermore, it has a hole 202 on the outward face of top board 41 with slit 434a. Hole 202 is a through-hole to the cavity of receiving member 201. One hole 202 is positioned higher than slit 434a. It is possible to have several holes 202. In the case that there are several holes 202, it is necessary to position them in line with the longer direction of top board 41.

Insertion member 203 is sized to fit the cavity of receiving member 201, as described in FIG. 4. Insertion member 203 is fitted to a cavity of receiving member 201 from the opposite side of top board 41. Insertion member 203 is positioned in the cavity of receiving member 201, so as to be movable in a direction away from or approaching top board 41. Insertion member 203 has hole 204 formed in receiving member 201 on the opposite side to the side on which hole 202 is positioned. And hole 204 is as large as that of hole 202. Here, hole 204 can be a through-hole. Besides, several holes 204 are opened as opposed to hole 202 of receiving member 201. Hole 204 is arranged in line along the movement direction of insertion member 203.

Fastening member 205 is a stick shaped member large enough to pass through hole 202. Moreover, fastening member 205 is long enough to pass through hole 202 and reach hole 204.

The operator aligns hole 202 and hole 204 in opposing positions, and causes fastening member 205 to pass thorough hole 202, then places it in hole 204. This will cause insertion member 203 to be affixed to receiving member 201. And the operator can change the distance in an orthogonal direction to top board 41 of plate member 433a, by changing hole 204 provided with fastening member 205.

As above, by changing the length of plate member 433a, it is possible to change the height of support section 43.

In the present embodiment, in order to simplify the configuration, the length of plate member 433a is changed at the position of the hole on insertion member 204, but other configurations can also be used. For example, a configuration is available that provides a gear, etc., which can be fixed between insertion member 204 and receiving member 201, to make the length of plate member 433a changeable. And, in the present embodiment, the length of plate member 433a is changed, but other parts of the configuration may also be modified, for example the part between hinge section 432a and top board 43, is also available.

As described above, support section 43, which is related to the present embodiment, has an adjustable height. This makes it possible to arrange the RF coils properly, adjusting to the body size of the patient. Therefore, it is possible to operate MRI imaging with a high degree of accuracy for any kind of patient.

What is claimed is:

1. An MRI apparatus comprising:
   a high frequency coil that detects the radiated nuclear magnetic resonance signals from a test body,
   a bed apparatus having a top board on which said test body is placed and a support section positioned on both edges of a shorter direction of said top board, the support section having a hinge section that is connected to an edge of said top board in the shorter direction at one edge of a support post and performs a hinge movement in the shorter direction, and having a receiving member on another edge of the support post across said test body and to support said high frequency coil when said support post stands up due to the movement of the hinge section, and
   an image generator configured to generate image data on the basis of said nuclear magnetic resonance signals.

2. The MRI apparatus of claim 1, wherein said support post has a width along a longer direction of said top board.

3. The MRI apparatus of claim 1, further comprising a belt member connected to said support post that causes said support post to stand across said top board and by pulling from the opposite side of the shorter direction, wherein said support post is collapsed in the opposite direction from said top board due to said hinge movement.

4. The MRI apparatus of claim 1, wherein a rail is positioned along a longer direction on said both edges of the shorter direction of said top board, and said hinge section is connected to said rail so as to move along said rail in the longer direction of said top board.

5. The MRI apparatus of claim 3, wherein said belt member is connected removably to said support section.

6. The MRI apparatus of claim 1, wherein said support section has a hinge mechanism between said support post and said receiving member.

7. The MRI apparatus of claim 1, wherein between said test body and said top board, a sheet that is water repellent on the side of said top board is further comprised, and said belt member is positioned so as to pass through between said sheet and said top board.

8. The MRI apparatus of claim 7, wherein said sheet has a rail on both edges of the shorter direction, wherein a connection member that is able to move along the longer direction of said sheet on said rail is further comprised, and said belt member is positioned so as to pass through said connection member, and to pass through between said sheet and said top board.

9. The MRI apparatus of claim 1, wherein said support post has a variable length in a direction orthogonal to a longer direction of said top board.

10. An MRI bed apparatus comprising:
    a top board on which a test body is placed, and
    a support section positioned on both edges of a shorter direction of said top board, with a hinge section that is connected to an edge of said top board in the shorter direction at one edge of a support post and performs a hinge movement in the shorter direction, and having a receiving member on another edge of the support post across said test body and to support a high frequency coil when said support post stands up due to the movement of the hinge section.

* * * * *